United States Patent [19]
Guterman et al.

[11] Patent Number: 5,910,925
[45] Date of Patent: Jun. 8, 1999

[54] EEPROM WITH SPLIT GATE SOURCE SIDE INJECTION

[75] Inventors: Daniel C. Guterman, Fremont; Gheorghe Samachisa, San Jose; Yupin Kawing Fong, Fremont; Eliyahou Harari, Los Gatos, all of Calif.

[73] Assignee: Sandisk Corporation, Sunnyvale, Calif.

[21] Appl. No.: 09/065,409

[22] Filed: Apr. 23, 1998

Related U.S. Application Data

[62] Division of application No. 08/639,128, Apr. 26, 1996, which is a continuation of application No. 08/193,707, Feb. 9, 1994, Pat. No. 5,776,810, which is a division of application No. 07/820,364, Jan. 14, 1992, Pat. No. 5,313,421.

[51] Int. Cl.⁶ .................................................. G11C 13/00
[52] U.S. Cl. ................................ 365/230.01; 365/189.01
[58] Field of Search ........................... 365/230.01, 189.01

[56] References Cited

U.S. PATENT DOCUMENTS

Re. 32,401  4/1987  Beilstein, Jr. et al. ................ 365/182
4,151,020  4/1979  McElroy .................................. 148/187

(List continued on next page.)

FOREIGN PATENT DOCUMENTS 0373830   6/1990   European Pat. Off. .
61-181168  8/1986   Japan .
1-304784  12/1989   Japan .
2-360      1/1990   Japan .

OTHER PUBLICATIONS

K. Naruke et al., "A New Flash–Erase EEPROM Cell with A Sidewall Select–Gate On Its Source Side", IEDM 89–603, IEEE (1989), pp. 603–606.

M. Kamiya et al., "EPROM Cell with High Gate Injection Efficiency", IEDM 82–741, IEEE (1982), pp. 741–744.

J. Van Houdt, et al., "A 5–Volt–Only Fast–Programmable Flash EEPROM Cell with A Double Polysilicon Split–Gate Structure", Interuniversity Microelectronics Center (Feb. 1991).

Yale Ma, et al. "A Dual–bit Split–Gate EEPROM (DSG) Cell in Contactless Array for Single–Vcc High Density Flash Memories", IEDM 94–57, IEEE (1994), pp. 57–60.

G.S. Alberts et al., "Multi-Bit Storage FET EAROM Cell", G.S. IBM Technical Disclosure Bulletin, vol. 24, No. 7A (Dec. 1981), pp. 3311–3314.

Takeshi Nakayama, "A 5–V–only One–Transistor 256K EEPROM with Page–Mode Erase", IEEE (Aug. 1989), vol. 24, No. 4, pp. 911–915.

Mike McConnell, et al., "An Experimental 4–Mb Flash EEPROM with Sector Erase", IEEE (Apr. 1991), vol. 26, No. 4, pp. 484–489.

Masaki Momodomi, et al., "A–4–Mb Flash EEPROM with Sector Erase", IEEE (Apr. 1991), vol. 26, No. 4, pp. 484–489.

(List continued on next page.)

Primary Examiner—Terrell W. Fears
Attorney, Agent, or Firm—Steven F. Caserza; Flehr, Hohbach, Test, Albritton & Herbert

[57] ABSTRACT

A novel memory structure in which memory arrays are organized in sectors with each sector being formed of a single column or a group of columns having their control gates connected in common. In one embodiment, a high speed shift register is used in place of a row decoder to serially shift in data for the word lines, with all data for each word line of a sector being contained in the shift register on completion of its serial loading. In one embodiment, speed is improved by utilizing a parallel loaded buffer register which receives parallel data from the high speed shift register and holds that data during the write operation, allowing the shift register to receive serial loaded data during the write operation for use in a subsequent write operation.

6 Claims, 12 Drawing Sheets

U.S. PATENT DOCUMENTS

| | | | |
|---|---|---|---|
| 4,151,021 | 4/1979 | McElroy | 148/187 |
| 4,184,207 | 1/1980 | McElroy | 365/185 |
| 4,202,044 | 5/1980 | Beilstein, Jr. et al. | 365/182 |
| 4,271,421 | 6/1981 | McElroy | 357/41 |
| 4,302,766 | 11/1981 | Guterman et al. | 357/41 |
| 4,331,968 | 5/1982 | Gosney, Jr. et al. | 357/23 |
| 4,380,057 | 4/1983 | Kotecha et al. | 365/185 |
| 4,456,971 | 6/1984 | Fukuda et al. | 364/900 |
| 4,462,090 | 7/1984 | Iizuka | 365/185 |
| 4,488,265 | 12/1984 | Kotecha | 365/189 |
| 4,561,004 | 12/1985 | Kuo et al. | 357/23.5 |
| 4,583,201 | 4/1986 | Bertin et al. | 365/104 |
| 4,622,656 | 11/1986 | Kamiya et al. | 365/185 |
| 4,652,897 | 3/1987 | Okuyama et al. | 357/23.5 |
| 4,794,565 | 12/1988 | Wu et al. | 365/185 |
| 4,803,529 | 2/1989 | Masuoka | 357/23.5 |
| 4,805,142 | 2/1989 | Bertin et al. | 365/100 |
| 4,811,285 | 3/1989 | Walker et al. | 365/149 |
| 4,811,294 | 3/1989 | Kobayashi et al. | 365/189 |
| 4,821,236 | 4/1989 | Hayashi et al. | 365/185 |
| 4,943,962 | 7/1990 | Imamiya et al. | 365/230.08 |
| 4,990,979 | 2/1991 | Otto | 357/23.5 |
| 5,028,553 | 7/1991 | Esquivel et al. | 437/43 |
| 5,029,130 | 7/1991 | Yeh | 365/185 |
| 5,045,488 | 9/1991 | Yeh | 437/43 |
| 5,057,886 | 10/1991 | Riemenschneider et al. | 357/23.5 |
| 5,067,108 | 11/1991 | Jenq | 365/185 |
| 5,070,032 | 12/1991 | Yuan et al. | 437/43 |
| 5,081,054 | 1/1992 | Wu et al. | 437/43 |
| 5,081,056 | 1/1992 | Mazzali et al. | 437/43 |
| 5,095,344 | 3/1992 | Harari | 357/23.5 |
| 5,147,816 | 9/1992 | Gill et al. | 437/52 |
| 5,172,338 | 12/1992 | Mehrotra et al. | 365/185 |
| 5,204,841 | 4/1993 | Chappell et al. | 365/230.05 |
| 5,225,361 | 7/1993 | Kakiuchi et al. | 437/43 |
| 5,247,485 | 9/1993 | Ide | 365/230.01 |
| 5,264,384 | 11/1993 | Kaya et al. | 437/43 |
| 5,278,439 | 1/1994 | Ma et al. | 257/319 |
| 5,280,446 | 1/1994 | Ma et al. | 365/185 |
| 5,284,784 | 2/1994 | Manley | 437/43 |
| 5,297,148 | 3/1994 | Harari et al. | 371/10.2 |
| 5,313,421 | 5/1994 | Guterman et al. | 365/185 |
| 5,323,355 | 6/1994 | Kato | 365/230.01 |
| 5,355,347 | 10/1994 | Cioaca | 365/230.08 |
| 5,378,643 | 1/1995 | Ajika et al. | 437/43 |
| 5,396,468 | 3/1995 | Harari et al. | 365/218 |
| 5,412,600 | 5/1995 | Nakajima | 365/185 |
| 5,606,521 | 2/1997 | Kuo et al. | 365/149 |
| 5,656,840 | 8/1997 | Yang | 257/316 |
| 5,708,285 | 1/1998 | Otani et al. | 257/315 |

OTHER PUBLICATIONS

Fujio Masuoka, et al., "A 256–kbit Flash E$^2$PROM Using Triple–Polysilicon Technology", IEEE (Aug. 1987).

Dumitru Cioaca, et al., "A Million–Cycle 256K EEPROM", IEEE (Oct. 1987), vol. SC–22, No. 5, pp. 684–692.

Cristiano Calligaro, et al., "A New Serial Sensing Approach for Multistorage Non–Volatile Memories", IEEE (1995), pp. 21–26.

Min–hwa Chi, et al., "Multi–level Flash/EPROM Memories: New Self–convergent Programming Methods for Low–voltage Applications", IEDM 95–271, IEEE (1995), pp. 271–274.

EEPROM WITH SPLIT GATE SOURCE SIDE INJECTION

CROSS REFERENCE TO RELATED APPLICATIONS

This application is a divisional of U.S. Ser. No. 08/639,128, filed Apr. 26, 1996, now allowed, which is a continuation of U.S. Ser. No. 08/193,707, filed Feb. 9, 1994, now U.S. Pat. No. 5,776,810, which in turn is a divisional of U.S. Ser. No. 07/820,364, filed Jan. 14, 1992, now U.S. Pat. No. 5,313,421, issued May 17, 1994.

TECHNICAL FIELD

This invention pertains to semiconductor memory cells and arrays, more particularly to electrically erasable programmable read only memories.

BACKGROUND

Erasable programmable read only memories (EPROMs) and electrically erasable programmable read only (EEPROMs) are well known in the art. These devices have the ability to store data in non-volatile fashion, while also being capable of being erased and rewritten as desired. EPROM devices are typically erased by exposing the integrated circuit device to ultraviolet radiation, while EEPROMs allow erasure to be performed electrically.

One form of EEPROM device includes a so-called "split-gate" electrode, in which the control gate includes a first portion overlaying a floating gate and a second portion directly overlaying the channel. Such a split gate structure is described in a 5-Volt-Only Fast-Programmable Flash EEPROM Cell with a Double Polysilicon Split-Gate Structure by J. Van Houdt et al, Eleventh IEEE Non-Volatile Semiconductor Workshop, February 1991, in which charge is injected into the floating gate from the source side of the cell. U.S. Pat. No. 4,652,897 describes an EEPROM device which does not utilize a split-gate, but which also provides injection to the floating gate from the source side of the device.

As described in the above referenced U.S. Pat. No. 4,652,897, memory cells are typically arranged in an array, as is well known in the art. One form of such an array utilizes buried diffusions, in which source and array regions are covered with a fairly thick layer of insulating material. This is shown for example, in U.S. Pat. Nos. 4,151,020; 4,151,021; 4,184,207; and 4,271,421. Such buried diffusion devices often utilize a virtual ground approach, in which columns connecting the sources of a first column of memory cells also serves to connect drains of an adjacent column of memory cells.

While many EEPROM devices utilize two layers of polycrystalline silicon, one for the formation of the floating gate, and the other for the formation of the control gate and possibly electrical interconnects, other EEPROM devices utilize three layers of polycrystalline silicon. For example, U.S. Pat. No. 4,302,766 provides a first polycrystalline silicon layer for the floating gate, a second polycrystalline silicon layer for the control gate, and a third polycrystalline silicon layer coupled through an erase window to a portion of the first polycrystalline silicon layer for use during erasure of the cell. U.S. Pat. No. 4,331,968 also uses a third layer of polycrystalline silicon to form an erase gate, while U.S. Pat. No. 4,462,090 forms an addressing gate electrode utilizing a third layer of polycrystalline silicon. U.S. Pat. Nos. 4,561,004 and 4,803,529 also use three layers of polycrystalline silicon in their own specific configurations. Japanese Patent Publication 61-181168 appears to utilize three layers of polycrystalline silicon to provide additional capacitive coupling to the floating gate. Japanese Patent Publication 63-265391 appears to pertain to a buried diffusion array, possibly utilizing virtual grounds.

European Patent Application 0373830 describes an EEPROM in which two polycrystalline silicon layers are used, with the second layer of polycrystalline silicon having two pieces, one of which provides the erase function, and one of which provides the steering function.

"A New Flash-Erase EEPROM Cell With a Sidewall Select-Gate on its Source Side" by K. Naruke et al. IEDM-89-603 and U.S. Pat. No. 4,794,565 describe an EEPROM utilizing a side wall select gate located on the source side of the field effect transistor.

"EPROM Cell With High Gate Injection Efficiency" by M. Kamiya et al. IEDM 82-741, and U.S. Pat. No. 4,622,656 describe an EEPROM device in which a reduced programming voltage is provided by having a highly doped channel region under the select gate, and the channel region under the floating gate being either lightly doped or doped to the opposite conductivity type, thereby providing a significant surface potential gap at the transition location of the channel.

SUMMARY OF THE INVENTION

In accordance with the teachings of this invention, novel memory cells are described utilizing source-side injection. Source-side injection allows programming utilizing very small programming currents. If desired, in accordance with the teachings of this invention, to-be-programmed cells along a column are programmed simultaneously which, due to the small programming current required for each cell, does not require an unacceptably large programming current for any given programming operation. In one embodiment of this invention, the memory arrays are organized in sectors with each sector being formed of a single column or a group of columns having their control gates connected in common. In one embodiment, a high speed shift register is used in place of a row decoder in order to serially shift in the data for the word lines, with all of the data for each word line of a sector being contained in the shift register on completion of its serial loading. In one embodiment, additional speed is achieved by utilizing a parallel loaded buffer register which receives data in parallel from the high speed shift register and holds that data during the write operation, allowing the shift register to receive serial loaded data during the write operation for use in a subsequent write operation. In one embodiment, a verification is performed in parallel on all to-be-programmed cells in a column and the bit line current monitored. If all of the to-be-programmed cells have been properly programmed, the bit line current will be substantially zero. If bit line current is detected, another write operation is performed on all cells of the sector, and another verify operation is performed. This write/verify procedure is repeated until verification is successful, as detected by substantially zero bit line current.

Among the objectives of the novel cells constructed in accordance with this invention are avoidance of programming limitations such as:

1. High Channel Currents (Power) required for Programming.
2. High Drain Voltage Requirements, which increase with increased levels of erasure.

3. Loss of Read Performance associated with an increase in Programming Efficiency via Heavy Channel doping.
4. Program Wearout Associated with Maintaining a High Drain Bias on Cells exposed to this bias, including both those cells targeted for programming and those cells not targeted but still exposed to the voltage.

BRIEF DESCRIPTION OF THE DRAWINGS

FIG. 2b is a plan view of one embodiment of an array of memory cells constructed utilizing cells depicted in the cross-sectional view of FIG. 2a;

FIG. 7b is a cross-sectional view of the embodiment shown in the plan view of FIG. 7a.

DESCRIPTION OF SPECIFIC EMBODIMENTS

Figure 1A:
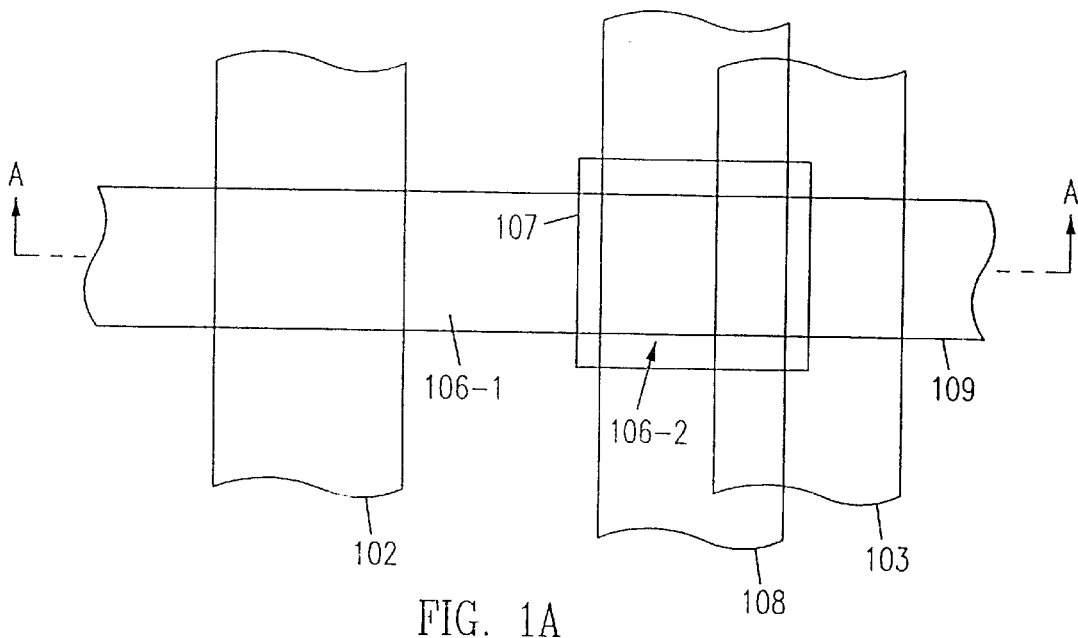
FIGS. 1a, 1b, and 1c, are cell layout, cross sectional diagram, and equivalent circuit schematic of one embodiment of this invention.
Figure 1B:
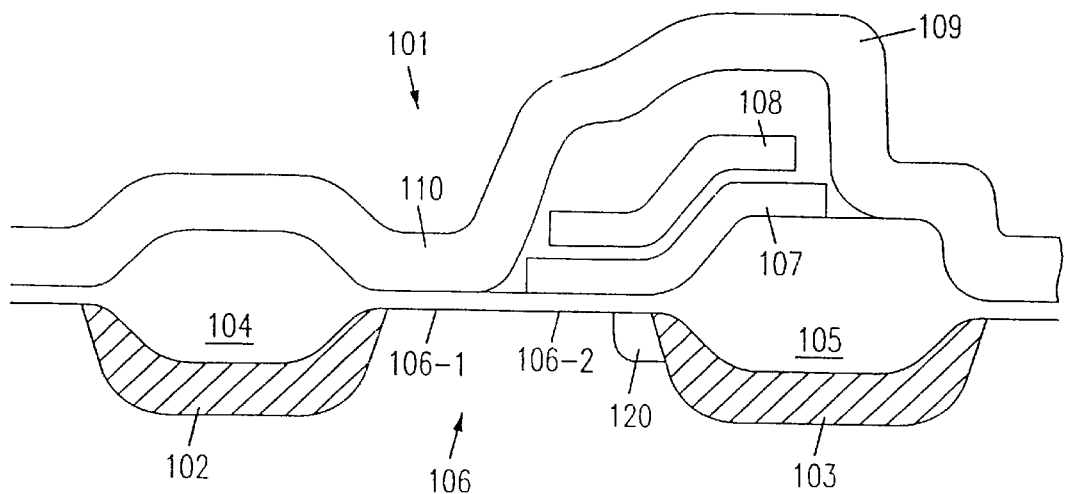
Figure 1C:
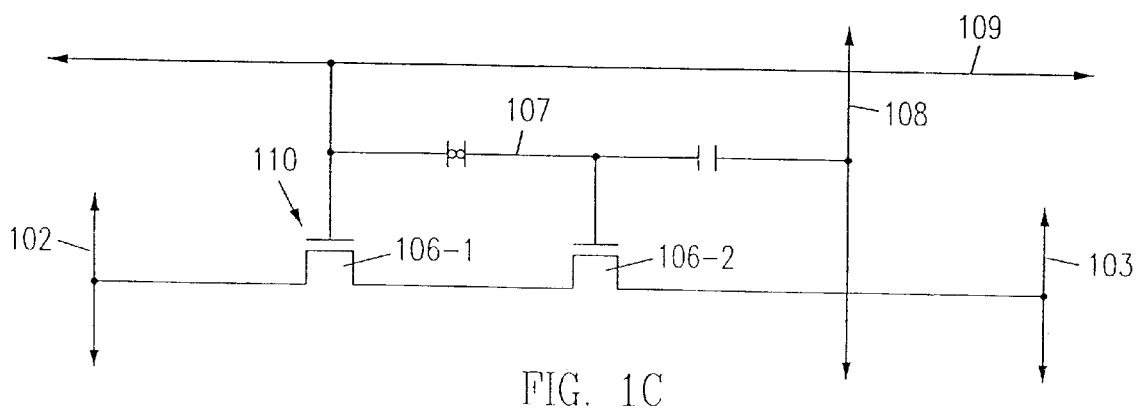

The cell layout, cross-sectional diagram and equivalent circuit schematic of one embodiment are shown in FIGS. 1a, 1b, and 1c, respectively. Similar reference numerals have been used in FIGS. 1a, 1b, and 1c. Referring to the cross-sectional view of FIG. 1b, this embodiment of the novel EEPROM cell, 101, of this invention includes a buried source region 102 and a buried drain region 103, each being buried by a relatively thick layer of dielectric 104 and 105, respectively. Channel region 106 is divided into two portions, a first portion 106-1 which is influenced by the third layer polycrystalline silicon 109 and which forms a select gate, and a second portion 106-2 which is influenced by floating gate 107 formed of a first layer of polycrystalline silicon and which, in turn, is influenced by control gate 108 formed of a second layer polycrystalline silicon. As is well known in the art, suitable dielectric layers such as thermally grown oxide are located between channel 106 and polycrystalline silicon layer 109 and polycrystalline silicon layer 107. Similarly, suitable dielectric layers such as oxide or composite oxide/nitride are formed between the three layers of polycrystalline silicon. Polycrystalline metal silicide can be used in place of one or more of the polycrystalline silicon layers 108 and 109. If desired, a highly-doped P+ region 120 is used within channel 106-2 adjacent buried drain region 103. This region 120 is formed, for example, as a double diffused MOS (DMOS) region in order to establish the threshold voltage $V_t$ of the memory transistor including channel 106-2. This helps to provide a stable threshold voltage, even though the amount of charges trapped in the gate oxide layer in the vicinity of the gap between 106-1 and 106-2 tends to increase with a large number of programming cycles.

An example of operating conditions and levels associated with the embodiment of FIG. 1b are shown in Table 1. High efficiency programming comes about by the ability to simultaneously create a high field region in channel 106-2 under the floating gate, which under the bias conditions of Table 1 occur near the gap between channels 106-1 and 106-2 (see above mentioned IEDM article of Kamiya for theory) while maintaining a low channel/current. Since this high field causes electron injection to floating gate 107 near the source side of channel 106-2, this type of operation is termed "source-side" injection. This mechanism provides high efficiency, low power programming by maintaining a low channel current via word line 109 throttling by using a bias operating near channel threshold, $VT_{p3}$. A major attribute of this type of operation is that it allows for a high drive condition in floating gate channel 106-2 under the floating gate (in fact it thrives on it), offering high-performance read, without degrading programming performance. This is because the very weak drive condition on the select transistor of channel 106-1 is established via the throttling mentioned above to achieve the high fields in the vicinity of the poly 3/poly 1 gap. These fields accelerate the electrons to sufficiently energetic levels (i.e. >3.1 eV) to surmount the $Si/SiO_2$ interface barrier at the source side of floating gate 107. Furthermore, there is a significant vertical component to that field (i.e. normal to the $Si/SiO_2$ surface) driving the electrons up to the surface of channel 106, and thereby assisting the injection into floating gate 107. No read performance penalty is incurred to establish this high field condition. This is in stark contrast to conventional drain side programming, wherein efficient program requires strong channel saturation which shuns high floating gate channel drives, strong overerase, or a weakly turned on series select transistor. These problems with drain side programming dictate high channel currents, care in overerase, potentially high drain voltages, and unfavorable fields (potentially subducting the channel below the surface at the drain side and driving electrons downward away from the floating gate).

Consequently, in accordance with the teachings of this invention, programming efficiencies ($I_G/I_D$) ranging from $10^{-5}$ to $10^{-3}$ are possible, with $I_D$ in the range of 1 μA during programming, which is two to three orders of magnitude smaller than conventional drain side programming. This offers the potential for very fast system level programming by allowing the programming of 100 times as many memory cells in parallel, thereby achieving a 100 fold increase in effective program speed compared with prior art drain side programming.

TABLE 1

State Table & Operating Conditions (FIG. 1b)

| Node Operation | Poly 3 (Word line) | Poly 2 (Steering Gate) | Drain (BN & Drain) | Source & (BN Source) |
|---|---|---|---|---|
| READ RELATED | | | | |
| STANDBY | 0 v | 0 v | 1.0 v or 0 v | 1.0 v or 0 v |
| READ SELECTED | 5 v | 0 v | 1.0 v or 0 v | 0 v or 1.0 v |
| READ UNSELECTED | 5 v | 0 v | 1.0 v | 1.0 v |
| ERASE RELATED | | | | |
| STANDBY | 5 v | 0 v | 0 v | 0 v |
| ERASE Option 1 | 5 v | −10 to −17 v | 0 v | 0 v |
| or Option 2 | 12–22 v | 0 v | 0 v | 0 v |
| PROGRAM RELATED | | | | |
| PROGRAM SELECTED | ~1.5 v | 14–20 v | 5–7 v | 0 v |
| PROGRAM UNSELECTED | 0 v | 14–20 v | 5–7 v | 0 v |
| | ~1.5 v | 14–20 v | 5–7 v | 5–7 v |
| | 0 v | 14–20 v | 0 v | 0 v |

A major feature of the cell of this invention is the decoupling of the select function (in this case poly 3 select transistor 110 in FIG. 1b) from the steering function (poly 2 control gate 108). During programming, this allows the independent control of cell selection/drain current throttling via poly 3 word line 109 bias (biased at slightly higher than $VT_{p3}$) and strong positive voltage coupling onto floating gate 107 (by raising poly 2 control gate 108 to a high voltage, such as about 12 volts). Also, in accordance with the teachings of this invention, the drain voltage can be adjusted independently of steering and select transistor voltage levels, to optimize programming.

During read, the decoupling feature of this invention provides two important advantages, and one exciting side benefit.

1. The ability to set control gate 108 at the optimum voltage level for memory state sensing, i.e. the best balanced reference point for both programmed and erased states. This independence is in contrast to conventional cells wherein the control gate also serves as the select transistor, dictating a voltage level consistent with selection (e.g. Vcc=5v±10%).

2. Improved margin by virtue of being a fixed, (potentially regulated) reference voltage, eliminating the Vcc variation of ±10% inherent to the word line bias levels. (This alone could improve the floating gate memory window by about 0.6v).

3. A side benefit of the ability to independently set the control gate voltage bias discussed above, offers the possibility of a simple way for re-referencing the memory cell for multi-state (i.e. more than conventional 2-state) encoded data. For example if the cell is encoded into three level states, (such as logical 1=strongly erased/high conducting, logical 2=partially programmed/weakly weakly conducting; logical 3=strongly programmed,) then the control gate voltage can be set at two different levels in a two pass read scheme. For example, in the first pass read the control gate voltage would be set at about 0v to discriminate between the logical 1 state and the logical 2/logical 3 states. In the second pass read the control/gate voltage is set to about 2v, to discriminate between the logical 3 state and the logical 1/logical 2 states. By combining the information of this two pass read (e.g. according to Table 2) the original state of the 3 state cell is recovered. This biasing can be done independently of sense amp reference cell considerations allowing a single sense amp/reference cell circuit to detect the different states via a multi-pass read scheme.

TABLE 2

| READ STATE | PASS 1 [Ref. = 0 v] | PASS 2 [Ref. = 2] |
|---|---|---|
| 1 | Hi | Hi |
| 2 | Lo | Hi |
| 3 | Lo | Lo |

The two options for erase operation/bias conditions shown in Table 1 stem from two different sets of considerations. The first option shown brings poly 2 control gate 108 to a large negative voltage, but allows poly 3 word line 109 to remain at a low voltage (e.g. 0v to 5v). This is desirable since the word lines and their decoders are preferably high performance, and repeated many times with a tightly pitched requirement, making high voltage word line requirements more difficult and real estate consuming to implement. Poly 2 control or steering gate 108 on the other hand could be common to a multiplicity of word lines (e.g. a sector consisting of 4 or more word lines), putting less demands on real estate and minimal impact to performance. Possible drawbacks of this approach are the process and device requirements to support both negative as well as positive polarity high voltage circuitry, and reduced steering effectiveness in that the channel cannot assist in steering by virtue of it being held at or near ground (i.e. can't go to large negative potential).

The second option of using high word line voltage bias for erase eliminates both of the above potential drawbacks, but burdens the high performance, tightly pitched word line/ driver with high voltage requirement.

Note that poly 2 is used only as a steering electrode during all three operations. Poly 3, which is the word line connection to the X-decoder, only sees 0V to 5V (other than for erase option 2), and its capacitance can be made relatively small. It is relatively easy to generate +5V and −17V on poly 2 since both writing and erasing are slow operations relative to reading and there is no DC current drain. The −17V does require high voltage PMOS in the erase decode, but the +5V on poly 3 aids in reducing the maximum negative voltage required on poly 2 during erase.

Figure 1D:
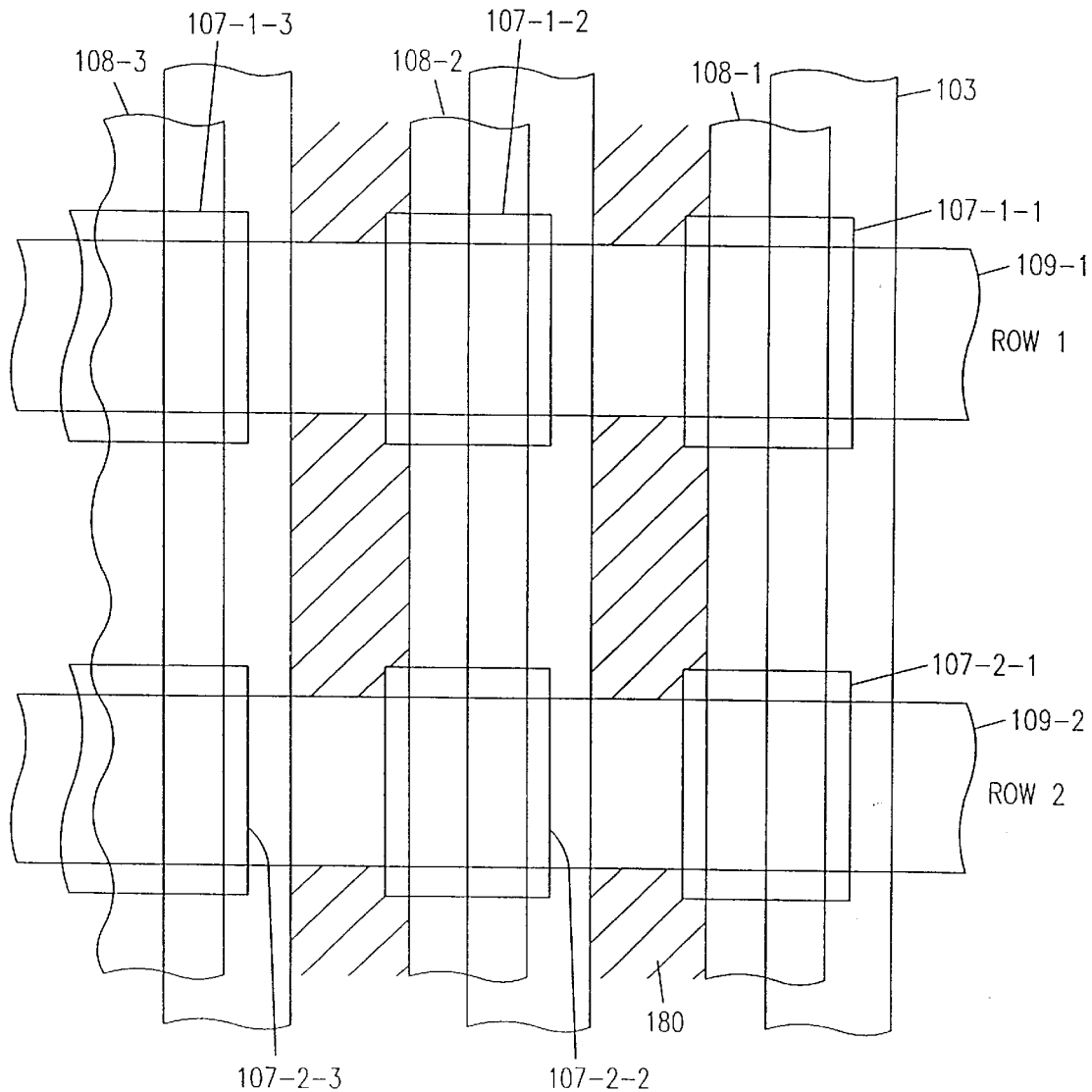
FIG. 1d is a plan view of one embodiment of an array consisting of a plurality of cells of FIGS. 1a–1c.

FIG. 1d is a plan view of one embodiment of an array consisting of a plurality of cells constructed as just described with respect to FIGS. 1a–1c, and using similar reference numerals. Also shown, are channel stop isolation regions 180.

Figure 1E:
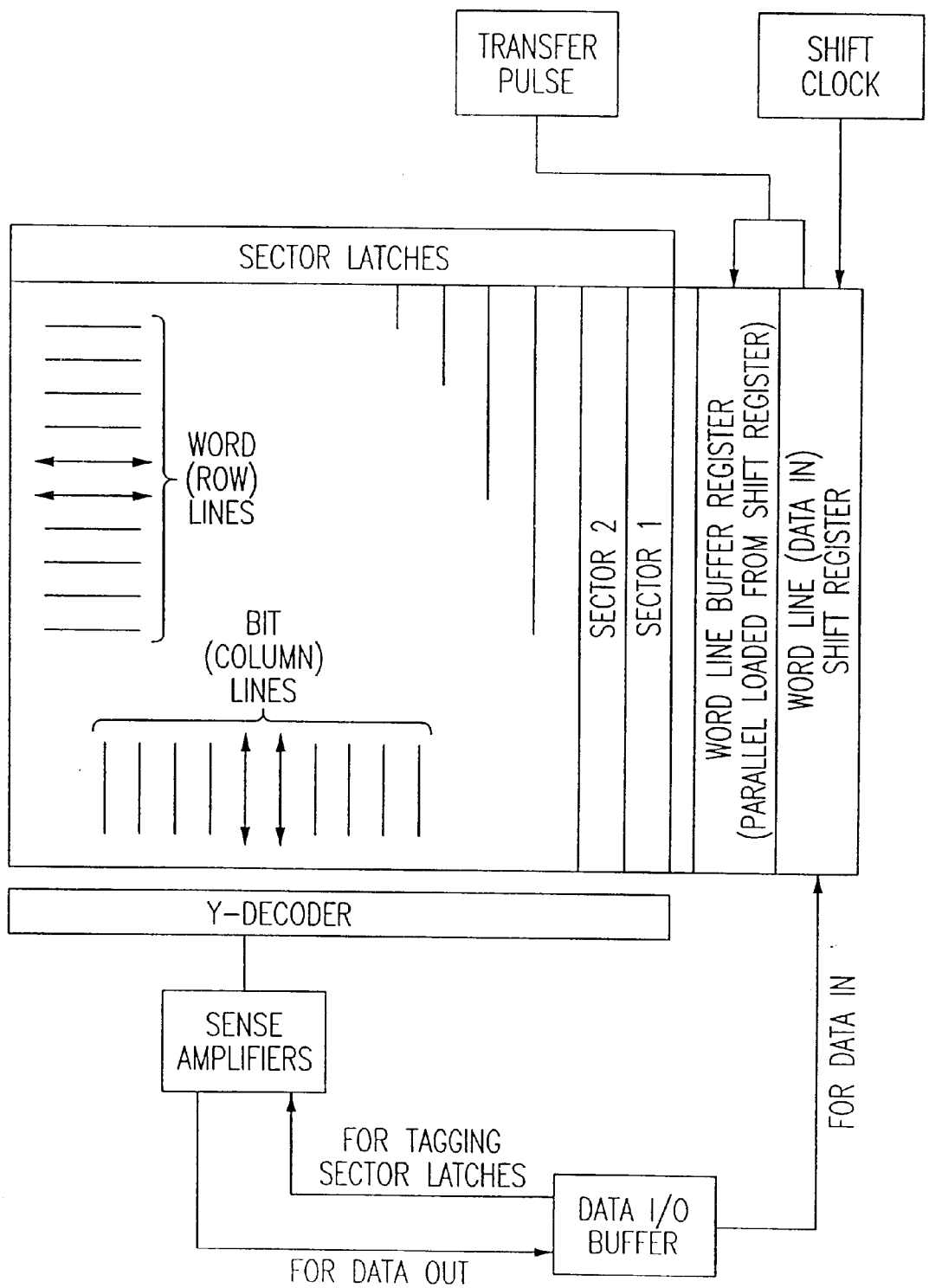
FIG. 1e is a block diagram depicting a memory array organized by sectors, with appropriate control circuitry.
Figure 1F:
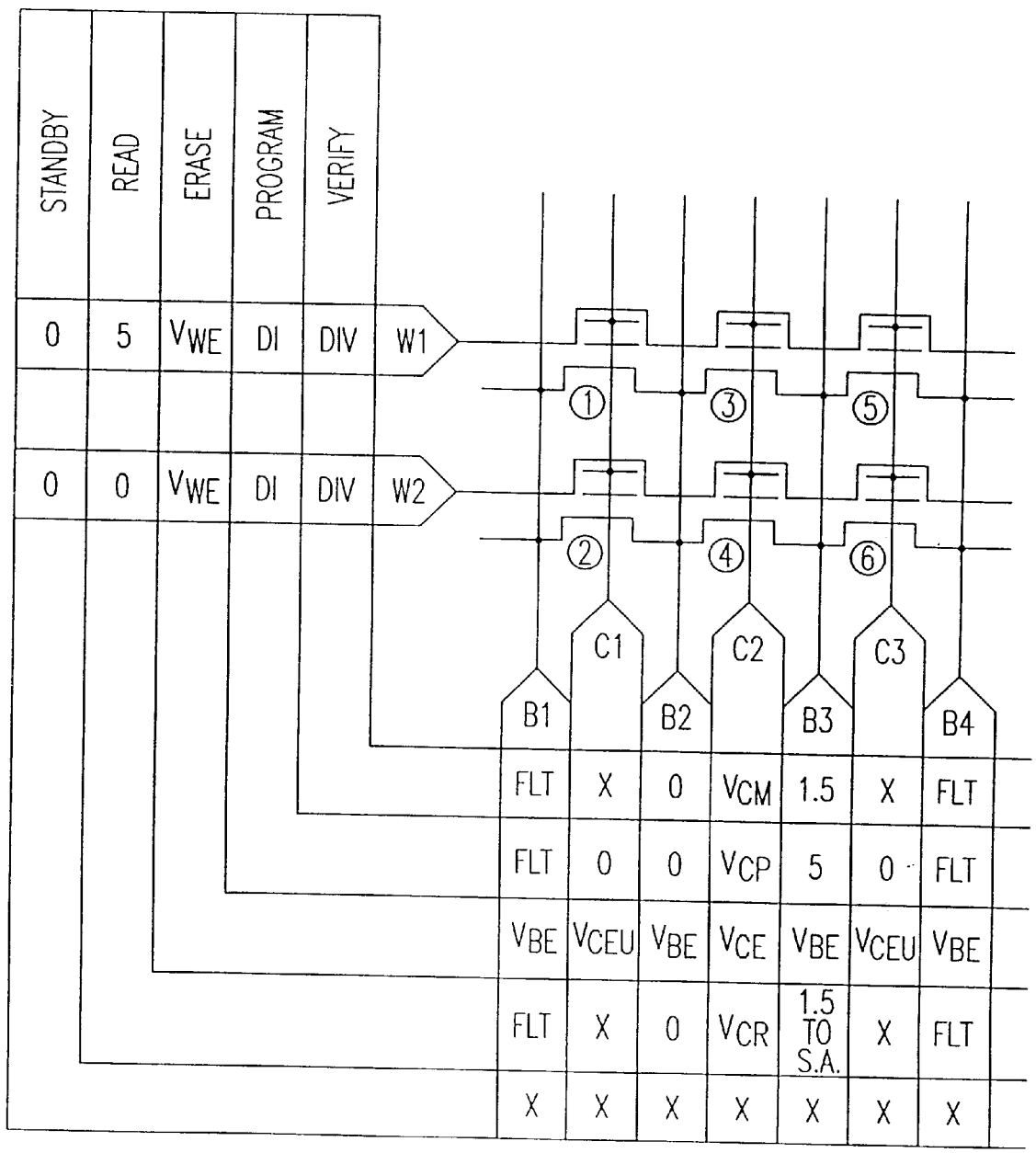
FIG. 1f depicts the operation of one embodiment of a memory array organized by sectors as shown in FIG. 1e.

FIG. 1e shows a block diagram of a memory array similar to that shown in the plan view of FIG. 1d which is organized by sectors, with appropriate control circuitry. Operation of one embodiment of such a memory array organized by sectors is shown in FIG. 1f. As shown in FIGS. 1e and 1f, in this embodiment sectors are formed by a single column or a group of columns having their control gate connected in common. This allows a high speed shift register to be used in place of a row decoder in order to serially shift in a whole block of column data for the word lines, with the data for each word line being contained in the shift register on completion of its serial loading. The use of such a high speed shift register saves circuit area on an integrated circuit by serving both encoding and latching functions normally performed by a row decoder. Furthermore, speed is improved by including a parallel loaded buffer register which receives data in parallel from the high speed shift register and holds that data during the write operation. While the write operation takes place based upon the data stored in the buffer register, the high speed serial shift register receives the next block of data for subsequent transfer to the buffer register for the next write operation. In one embodiment of this invention, each sector has an associated latch for tagging that sector in preparation for an erase of a plurality of tagged sectors.

In one embodiment of this invention, a sector is formed in a group of four cell columns, each column being 1024 bits tall with a common control gate and an associated sector latch. In this embodiment, verification of programming is performed in parallel on all to-be-programmed cells in a single column. Logical 0 state cells have word lines at 0 volts while logical 1 state cells have word lines at a positive voltage, such as 5 volts. The control gate and drain voltages are reduced to a verify level to allow for proper margin testing and the bit line current is monitored. If all of the to-be-programmed cells have been properly programmed, the bit line current will be 0 or substantially so. If not, it is known that one or more of the to-be-programmed cells in the column have not been properly programmed, and another write operation is performed on the entire column, thereby assuring that any incompletely ones of the to-be-written cells are again written. An additional verify step is performed to verify that the column has been properly programmed.

Figure 7A:
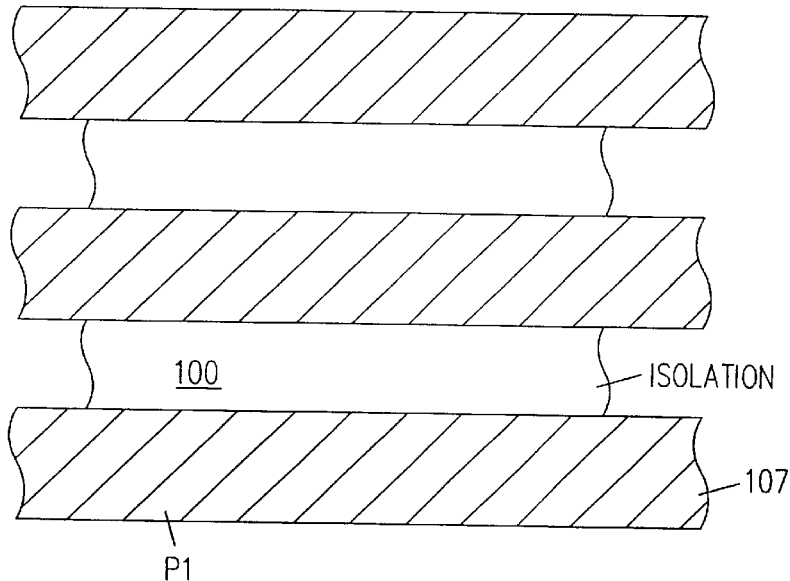
FIG. 7a is a plan view depicting a portion of a process sequence utilized in accordance with one embodiment of this invention.
Figure 7B:
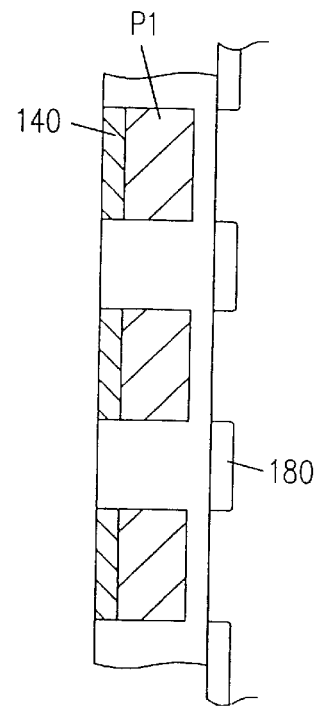

One embodiment of a process suitable for fabricating the structure having the cross-sectional view of FIG. 1b is now described. This embodiment can be implemented in a very small area with no need for an isoplanar oxide when utilizing a virtual ground, allowing an isolation implant to be placed in the remaining field which is not covered by diffusions or polycrystalline silicon and avoids susceptibility to substrate pitting associated with the SAMOS etch in the field isolation region not covered by poly 1. This is achieved, for example, with the following process sequence:

1. Form $BN^+$ bit lines in vertical strips. Grow approximately 1500 Å oxide on top of $BN^+$, and approximately 200–300 Å gate oxide.
2. As shown in FIGS. 7a and 7b, deposit poly 1 to a suitable conductance and etch in horizontal strips perpendicular to the $BN^+$ diffusion. Fill the spaces between adjacent strips of poly 1 with deposited oxide, such as CVD followed by an etch back. This approach protects the field isolation regions, and if desired it can be preceded by a boron channel stop implant.

An alternative for steps 1 and 2 of the above process sequence is forming horizontal strips of isolation oxide first, and then depositing $P_1$ and etched back in RIE to fill and planarize the horizontal grooves between adjacent strips of isolation oxide.

3. Form thin dielectric such as ONO of approximately 300–400 Å. covering poly 1 strips.
4. Deposit poly 2 and form a suitably thick dielectric overlayer (e.g., approximately 2000–3000 Å of CVD densified oxide). Etch this oxide and underlying poly 2 in long vertical strips parallel to bit line ($BN^+$) diffusions.
5. Form oxide spacers along edges of poly 2 and use edge of these spacers to define the floating gate by etching off exposed poly 1 (i.e. poly 1 not covered by poly 2 or by spacer).
6. Form tunnel erase oxide in a conventional manner, as described in U.S. patent application Ser. No. 323,779, filed Mar. 15, 1989, over exposed edges of poly 1 as well as gate oxide over the channel of the select transistor (channel 106-1 in FIG. 1b).
7. Deposit poly 3 or polysilicide, and form word lines in horizontal strips.

Figure 8:
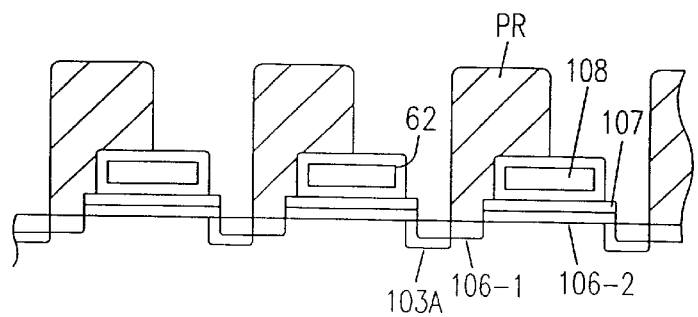
FIG. 8 is a cross-sectional view depicting a fabrication step suitable for use in accordance with the teachings of this invention.

Another embodiment for achieving a virtual ground cell without the use of the buried diffusion formed early in the process is now described. In place of the BN+ of step 1, after step 6 a photoresist masked arsenic source/drain implant is used, self-aligned to one edge of poly 2 after poly 1 stack formation but leaving an unimplanted region along the other edge to become the poly 3 controlled select transistor channel (see FIG. 8). The isolation oxide thickness formed earlier between poly 1 strips is made sufficiently thick to withstand the self-aligned poly 2/1 stack etch without exposing the substrate to pitting, but thin enough such that following this stack etch it is readily removed to expose the substrate to the source drain implant. This offers the benefit of reduced thermal drive of the arsenic junction laterally facilitating scaling. The remainder of the process steps of this embodiment follows the prior embodiment.

In summary, the novel cell of this invention offers the following benefits.

Very low programming current.

Low programming drain voltage requirement/eliminating associated high voltage.

Immunity of Programmability to increased levels of erase.

Adjustability of memory state for optimum read of both program and erased states.

Improved margin by elimination of sensitivity to ±10% Vcc variation on the steering element.

Potential for pure low voltage word line/decoder implementation.

Facilitates multi-state cell sensing.

Reduced susceptibility to source side hot-electron programming induced trapping by establishing a separate threshold control region at the drain.

Figure 1G:
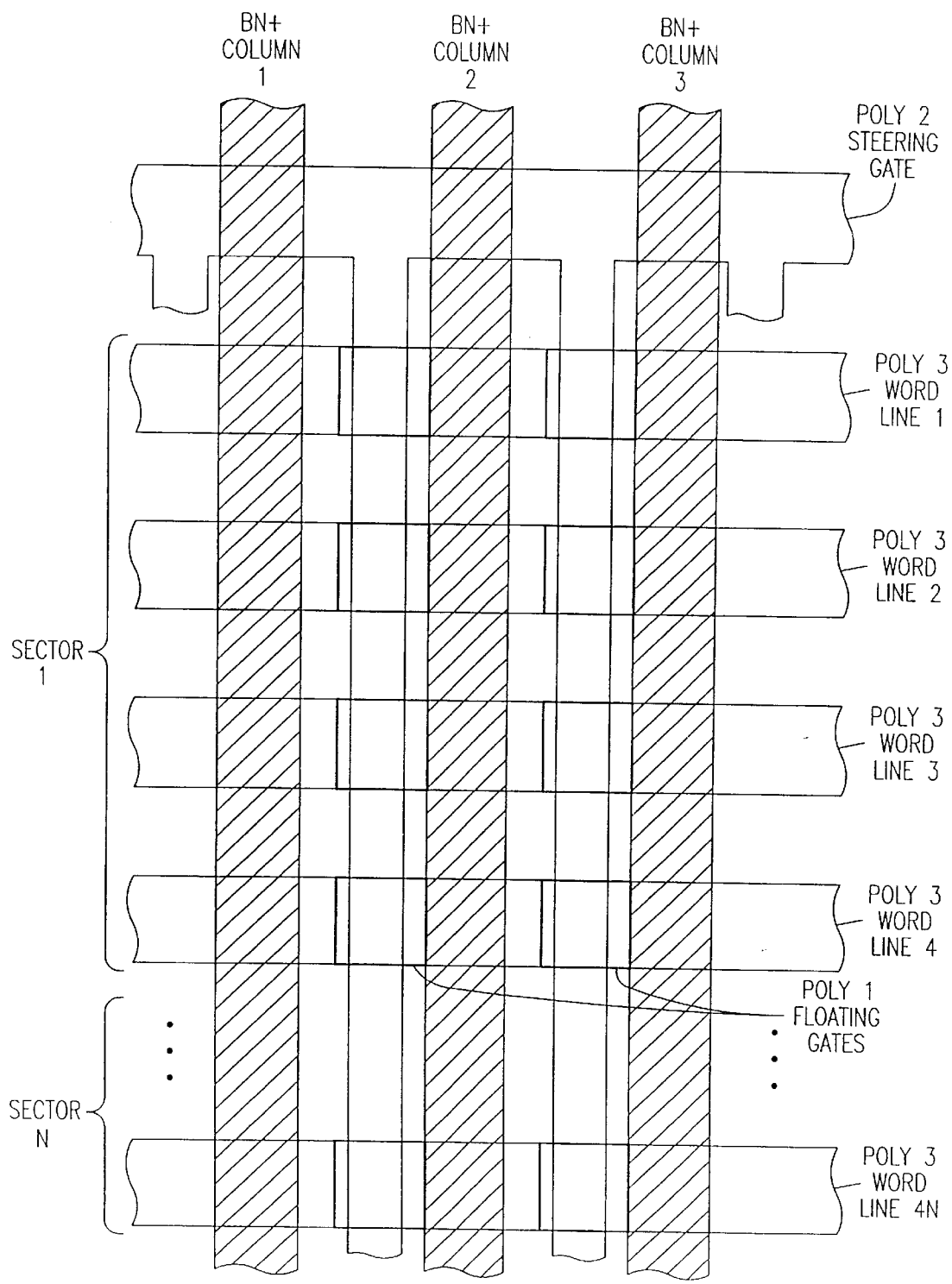
FIG. 1g is a plan view depicting an alternative array embodiment utilizing cells depicted in FIGS. 1a–1c.

A second array embodiment is similar to that of FIG. 1d but uses the cell embodiment shown in FIG. 1b, to form a row oriented sector architecture, is shown in FIG. 1g. A sector consists of a group of rows, four in this example, which are erased together. Erase uses option 2 of Table I, for this row oriented sector architecture, bringing all the poly 3 word lines of a sector to high voltage. The poly 2 steering gate is common to a group of N sectors where N can range from 1 to the full size of the memory array. Similarly the BN+ columns can alternatively continuously span the full length of the array or be broken down into a collection of shorter length, local columns. These connect to a global (full array length) column through a select transistor driven by an additional level of decoding. The local columns can range from 1 to N sectors. The preferred embodiment is to have local columns span the same number of sectors as the poly 2 steering gate. A preferred number of sectors, N, spanned by local columns and poly 2 steering is around 8. This is because if N is much smaller than 8, the area overhead for local column section devices and poly 2 steering gate routing is high in relation to the area of arrayed cells, while if N is much larger than 8, the benefits of having localized columns and poly 2 steering diminish. These benefits are: (1) reduced bit line capacitance improving read performance; (2) reduced repetitive exposure on unselected sectors to the raised voltage conditions on drains and steering electrodes when programming one sector within the N-sector group, and associated potential disturb phenomena; and (3) increased confinement of array related failures thereby increasing the efficiency of replacing such failures. Read, program and unselected conditions are as described in Table I, during read or program. The poly 3 word line in the selected row within the selected sector is turned on, 5 volts for read and approximately 1 volt for programming. Concurrently, the drain to source bias conditions are applied to the columns, approximately 5 volts for program and approximately 1.0–1.5 volts for read. In one embodiment, alternate bits in a selected row are programmed simultaneously, thereby permitting all bits in a selected row to be programmed utilizing two programming operations. In a similar manner, in this alternative embodiment, alternate bits in a selected row are read (or verified) simultaneously, thereby permitting all bits in a selected row to be read (or verified) utilizing two read (or verify) operations. After one row in the sector has finished reading or writing, the next row is selected, and so forth to the end of the sector. The resulting row oriented sector architecture and array operation is much more conventional than the column oriented sector of the first embodiment, and consequently operates in a more traditional manner. Both embodiments share the intrinsic low power capability of this invention, but the row oriented sector embodiment requires, in addition, a full complement of data registers to support massively parallel write and verify features.

Figure 2A:
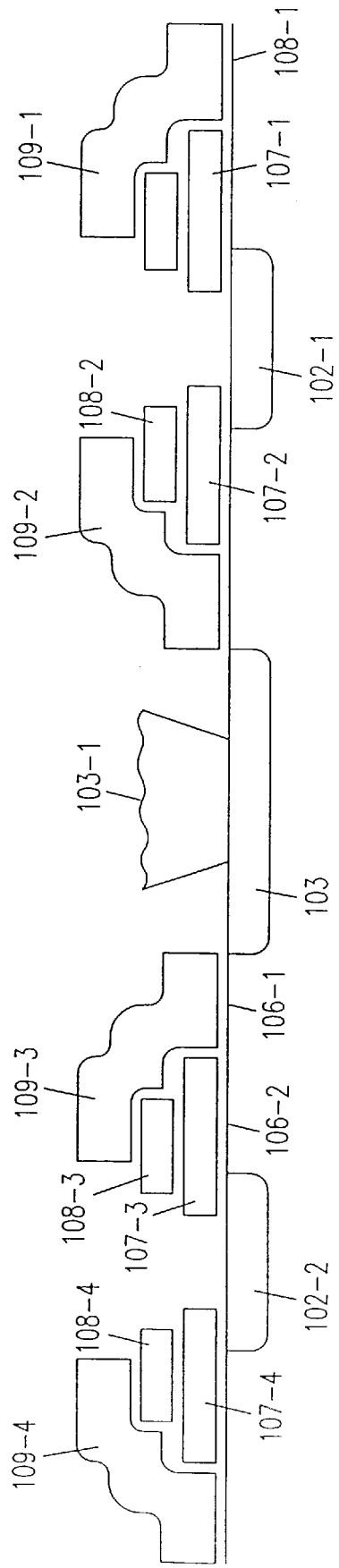
FIG. 2a is a cross-sectional view depicting an alternative embodiment of this invention similar that of FIG. 1b.

FIG. 2a shows an alternative array embodiment of this invention which does not utilize buried diffusion regions. Thus, source region 102 and drain region 103 are formed in a conventional manner and not buried by a thick dielectric layer as is the case in the embodiment of FIG. 1b. A plurality of memory cells are shown in FIG. 2a along a cross section of a typical array structure, with elements of one such cell numbered using reference numerals corresponding to similar structure in FIG. 1b. Table 3 depicts an example of the operating conditions appropriate for the embodiment of FIG. 2a. This a more traditional cell approach compared to the buried diffusion cell, with source/drain diffusions formed after all the polycrystalline silicon structures are formed. It requires one drain contact to metal bit line for every 2 cells, making it approximately 30% to 50% larger than the buried diffusion cell with similar layout rules. In all other respects, this alternative embodiment offers the same benefits as listed above for the buried diffusion embodiment of FIG. 1b.

Figure 2B:
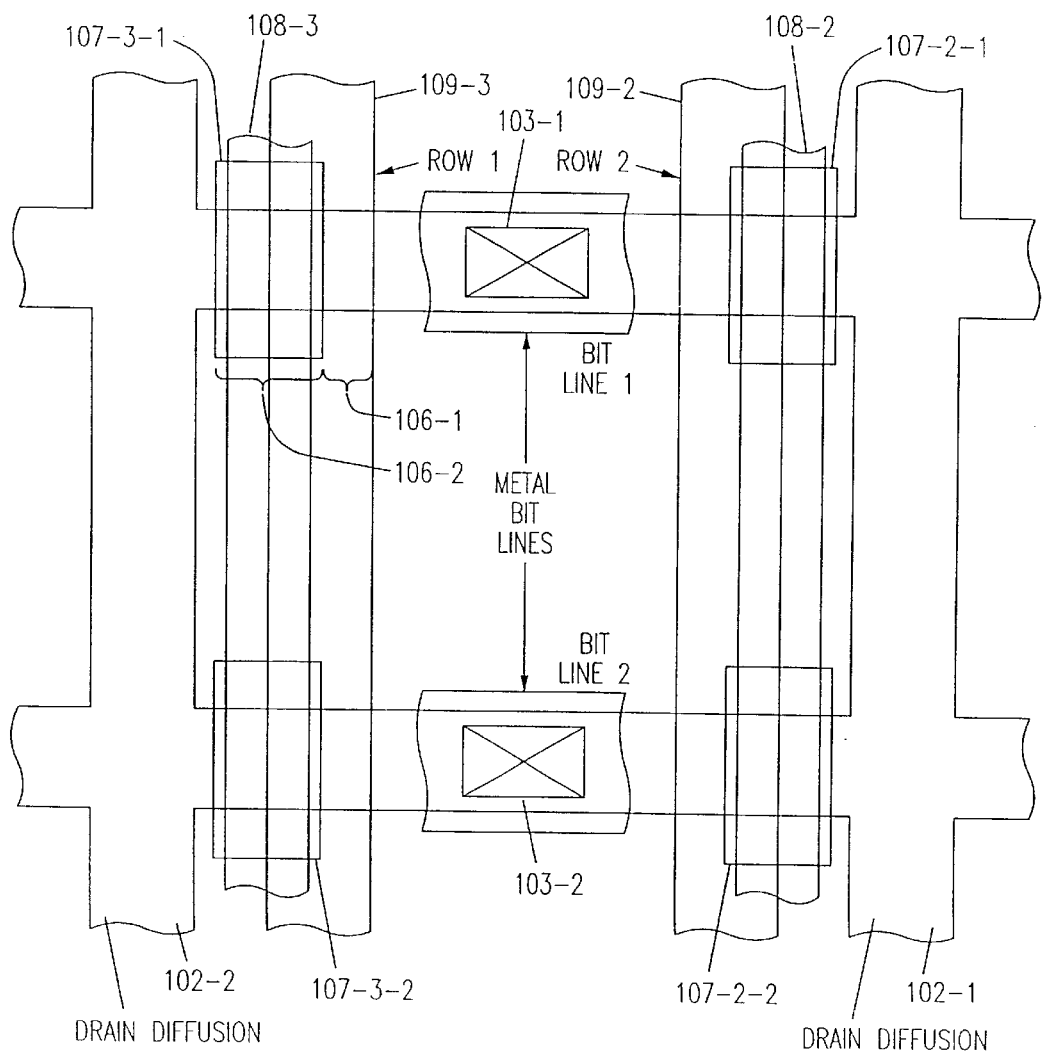

FIG. 2b is a plan view of one embodiment of an array of memory cells constructed as described above with reference to FIG. 2a.

Figure 2C:
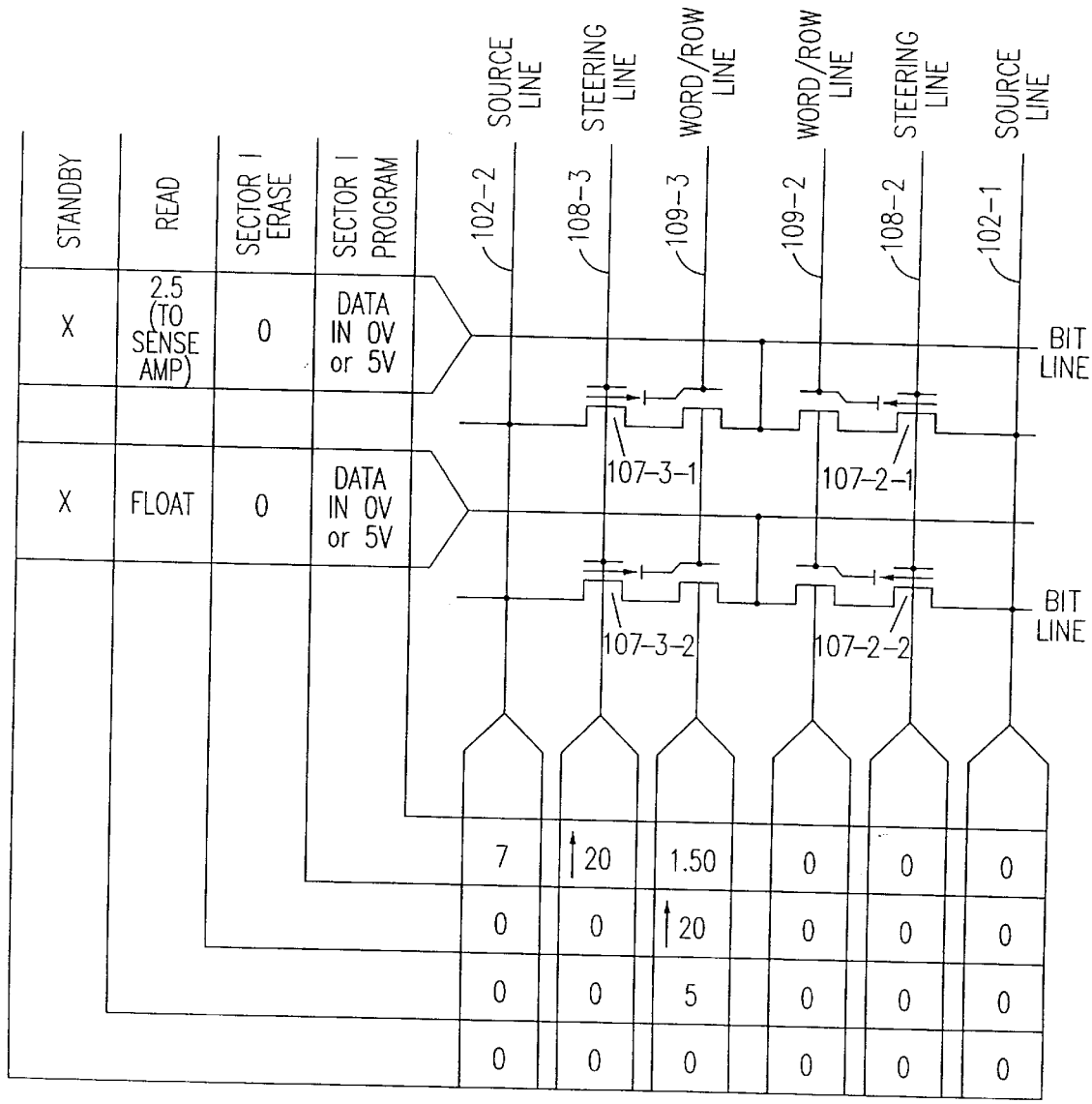
FIG. 2c is a diagram depicting the organization and operating condition of an array such as that of FIG. 2b.

FIG. 2c is an equivalent circuit diagram depicting the organization of such a memory array in sectors, with appropriate operating conditions and voltages shown. The preferred embodiment for a sector organized array uses two word lines which straddle a source line as part of a sector, along with their associated poly 2 steering gates and source line. A full sector consists of some multiple of such pairing (e.g. 2 such pairs or 4 word lines, each word line containing 128 bytes and overhead cells, and straddling two source lines, constitute one sector).

As shown in the embodiment of FIG. 2c, the steering lines are connected together within a sector as are the source lines (i.e. a sector which consists of row lines grouped together respectively and driven by common drivers). The embodiment described here confines the write operation to the sector being written to, while the bit line bias conditions (2.5v during read and approximately 5v possible during write) are non-disturbing to the cells because the bias is applied to the select transistor side of the cell and not to the floating gate side. In a two state cell, to write the cell to a logical one, the bit line is held at zero volts, causing the cell to program via source-side injection. Conversely, to inhibit writing, the bit line is held high (typically about 5 volts), thereby cutting off the channel, leaving the cell in the erased state.

Sector erase takes place by tagging the selected sector and raising the associated row lines to a sufficiently high voltage to erase the floating gates to their required erased levels.

Because of the low programming currents associated with source side injection (approximately 1–5 microamps/cell), massive parallel programming is made practical, e.g. a full row line of approximately 1000 cells is programmed in a single operation with total current less than approximately 1–5 mA, thus providing more than 100 times more efficiency than prior art drain side programming arrays.

TABLE 3

State Table & operating Conditions (FIG. 2a)

| Node Operation | Poly 3 (Word line) | Poly 2 (Steering Gate) | Drain | Source |
|---|---|---|---|---|
| READ RELATED | | | | |
| STANDBY | 0 v | 0 v | Don't care | 0 v |
| READ SELECTED | 5 v | 0 v | 2.5 v | 0 v |
| READ UNSELECTED | 5 v | 0 v | Don't care | 0 v |
| ERASE RELATED | | | | |
| STANDBY ERASE | 0 v | 0 v | 0 v | 0 v |
| Option 1 | 12 v–22 v | 0 v | 0 v | 0 v |
| Option 2 | 5 v | −10 v to −12 v | 0 v | 0 v |
| PROGRAM RELATED | | | | |
| PROGRAM SELECTED | ~1.0 v | 14–20 | 0 v | 5 v–8 v |
| PROGRAM | 0 v | 14–20 | 0 v | 5 v–8 v |
| UNSELECTED | ~1.0 v | 14–20 | 5 v | 5 v–8 v |
| | 0 v | 14–20 | 5 v | 5 v–8 v |

Figure 3:
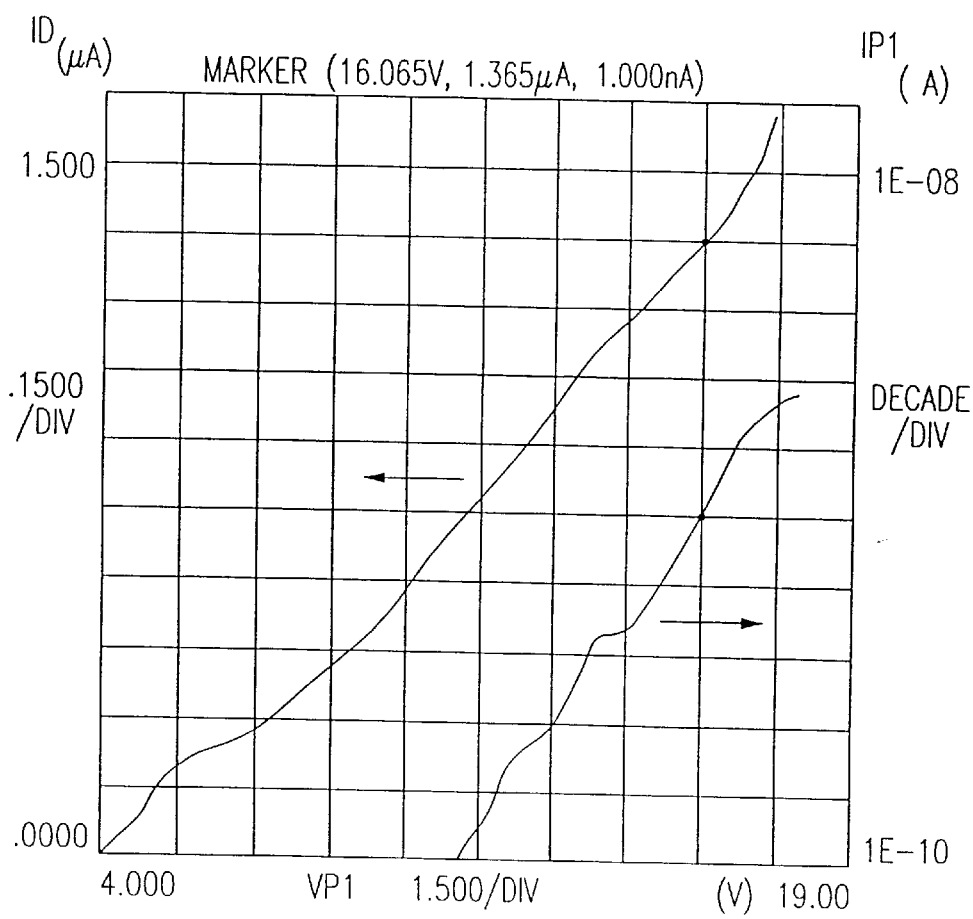
FIG. 3 is a graph depicting the operation of a memory cell of FIG. 1b.

FIG. 3 is a graph depicting the gate current into poly 1 gate 107 of FIG. 1b (which is not floating in the FIG. 3 test device to allow this measurement to be made) as a function of poly 1 gate voltage ($V_{poly\ 1}$) while keeping the select transistor 110 $V_{p2}$ at just above its threshold. In this way most of the potential drop in channel 106 of FIG. 1 occurs in channel portion 106-1 underneath gate 109 of select transistor 110, and electrons accelerated in this channel are then injected onto floating gate 107. From FIG. 3 it is seen the hot electron programming injection efficiency of this device is phenomenally high.

Various embodiments of a process suitable for fabricating a structure in accordance with the embodiment of FIGS. 1a–1d are now described. Reference can also be made to copending U.S. application Ser. No. 323,779 filed Mar. 15, 1989, and assigned to SunDisk, the assignee of this invention. Reference may also be made to fabrication process steps described earlier in this application. A starting substrate is used, for example a P type substrate (or a P type well region within an N type substrate). A layer of oxide is formed, followed by a layer of silicon nitride. The layer of silicon nitride is then patterned in order to expose those areas in which N+ source and drain regions are to be formed. The N+ source and drain regions are then formed, for example, by ion implantation of arsenic to a concentration of approximately $1 \times 10^{20}$ cm−3. The wafer is then oxidized in order to form oxide layers 104 and 105 in order to cause source and drain regions 102 and 103 to become "buried". Note that for the embodiment of FIG. 2a, this oxidation step is not utilized, as the source and drain regions are not "buried". The remaining portion of the nitride mask is then removed, and the oxide overlying channel regions 106-1 and 106-2 is removed. A new layer of gate oxide overlying channel regions 106-1 and 106-2 is formed, for example to a thickness within the range of 150 Å to 300 Å and implanted to the desired threshold (e.g. approximately −1v to +1v). Polycrystalline silicon is then formed on the wafer and patterned in order to form floating gate regions 107. If desired, the polycrystalline silicon layer is patterned in horizontal strips (per the orientation of FIG. 1a), with its horizontal extent patterned at the same time as the patterning of the second layer of polycrystalline silicon, as will be now described. Following the formation polycrystalline silicon layer 107 at this time, a layer of oxide or oxide/nitride dielectric is formed over the remaining portions of polycrystalline silicon layer 107. A second layer of polycrystalline silicon 108 is then formed and doped to a desired conductivity, for example 30 ohms/square. The second layer of polycrystalline silicon is then patterned into vertical strips (again, per the orientation of FIG. 1a). If the horizontal extent of polycrystalline silicon layer 107 was not earlier defined, this pattern step is also used to remove the layer of dielectric between the first and second layers of polycrystalline silicon in those areas where the first layer of polycrystalline silicon is to be patterned simultaneously with the patterning of the second layer of polycrystalline silicon. Following the first layer patterning, an additional layer of dielectric is formed on the wafer to form the gate dielectric above channel region 106-1, and above any other areas in the silicon substrate to which the third layer of polycrystalline silicon is to make a gate. These regions can then be implanted to the desired threshold voltage (e.g. approximately 0.5v to 1.5v). The third layer of polycrystalline silicon is for a transistor (ranging from ~200 Å to 500 Å in thickness) then formed and doped to appropriate conductivity, for example 20 ohms/square. Polycrystalline silicon layer 109 is then patterned in order to form word line 109.

In one embodiment of this invention, polycrystalline silicon layer 107 is patterned to form horizontal stripes and channel stop dopants (e.g. boron) are implanted into the exposed areas therebetween in order to form high threshold channel stop regions between adjacent rows of a memory array.

The thickness of the gate dielectric between channel 106-2 and polycrystalline silicon floating gate 107 can range from approximately 150 angstroms or less to approximately 300 angstroms or more, depending on performance tradeoffs. For increased drive for reading, a thinner gate dielectric is desired while for increased coupling between polycrystalline and silicon control gate 108 and floating gate 107 (helpful during programming) a thicker gate dielectric is desired.

Second Embodiment

Figure 5:
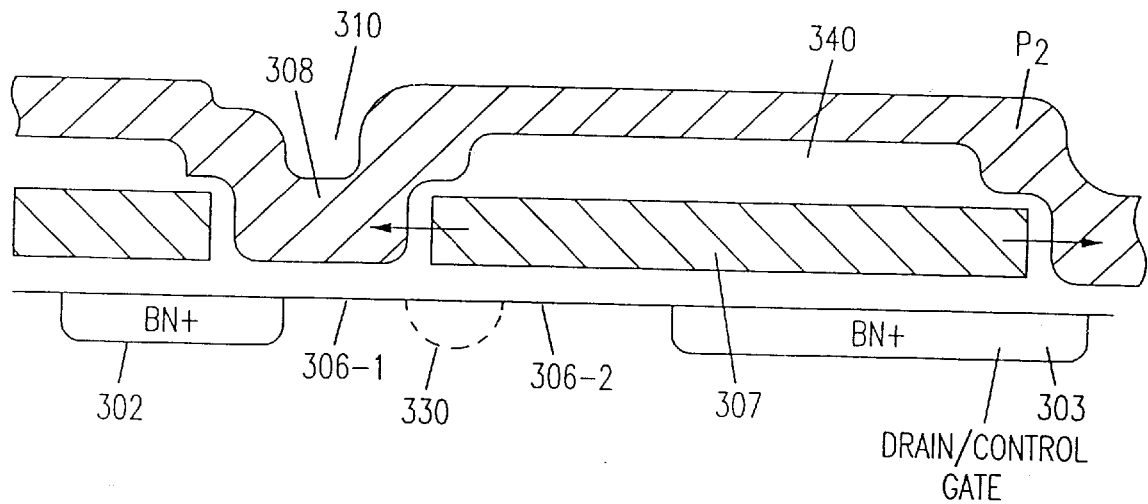
FIG. 5 is a cross-sectional view one embodiment of a 2-poly cell of this invention.

FIG. 5 is a two-poly embodiment in which programming occurs by taking drain 303 high, for example about 10V while raising control gate 308 just sufficiently so as to turn on select transistor 310. Since this $V_{CG}$ voltage can vary from one device to another it is possible to achieve the optimum injection conditions by keeping $V_{CG}$ at about 3V while raising source (virtual ground) 302 in a sawtooth fashion from about 0 to 3 volts and back to 0 again, with a period on the order approximately 1 microsecond.

This ensures that at some point along the sawtooth the optimum injection conditions are met. Reference can also be made to European Patent Application Serial No. 89312799.3 filed Aug. 12, 1989. To further enhance programming efficiency, in one embodiment a programming efficiency implant 330 (shown in dotted line) is introduced at the source side. To read the device, its source is 0V, drain is approximately 1.0v and $V_{CG}$ approximately 4.5–5v. To erase we employ poly 1-poly 2 tunneling between floating gate 307 in word line 308 at the tunneling zone, consisting of one or more of the floating gate edges, sidewall, corners of the top edge, portions of the top and portions of the bottom, of floating gate 307, associated with a tunnel oxide (400 Å–700 Å). Erase takes place with $V_{CG}$ approximately 12–22V, $V_D$=0V, $V_S$=0V. A capacitive decoupling dielectric (approximately 1500 to 2000 Å thick) 340 is formed on top of poly 1 to reduce the capacitance between poly 1 and poly 2.

In one embodiment of this invention, a high electrical field region is created in the channel far away from the reverse field region located in conventional devices near the drain. This is achieved, for example, by utilizing region 330 of increased doping concentration at the boundary between channels 306-1 and 306-2 under floating gate 307. In one embodiment, the width of region 330 is on the order of 0.1 microns. A larger dimension for region 330 can be counterproductive, reducing the select transistor drive with no gain in efficiency.

Figure 4:
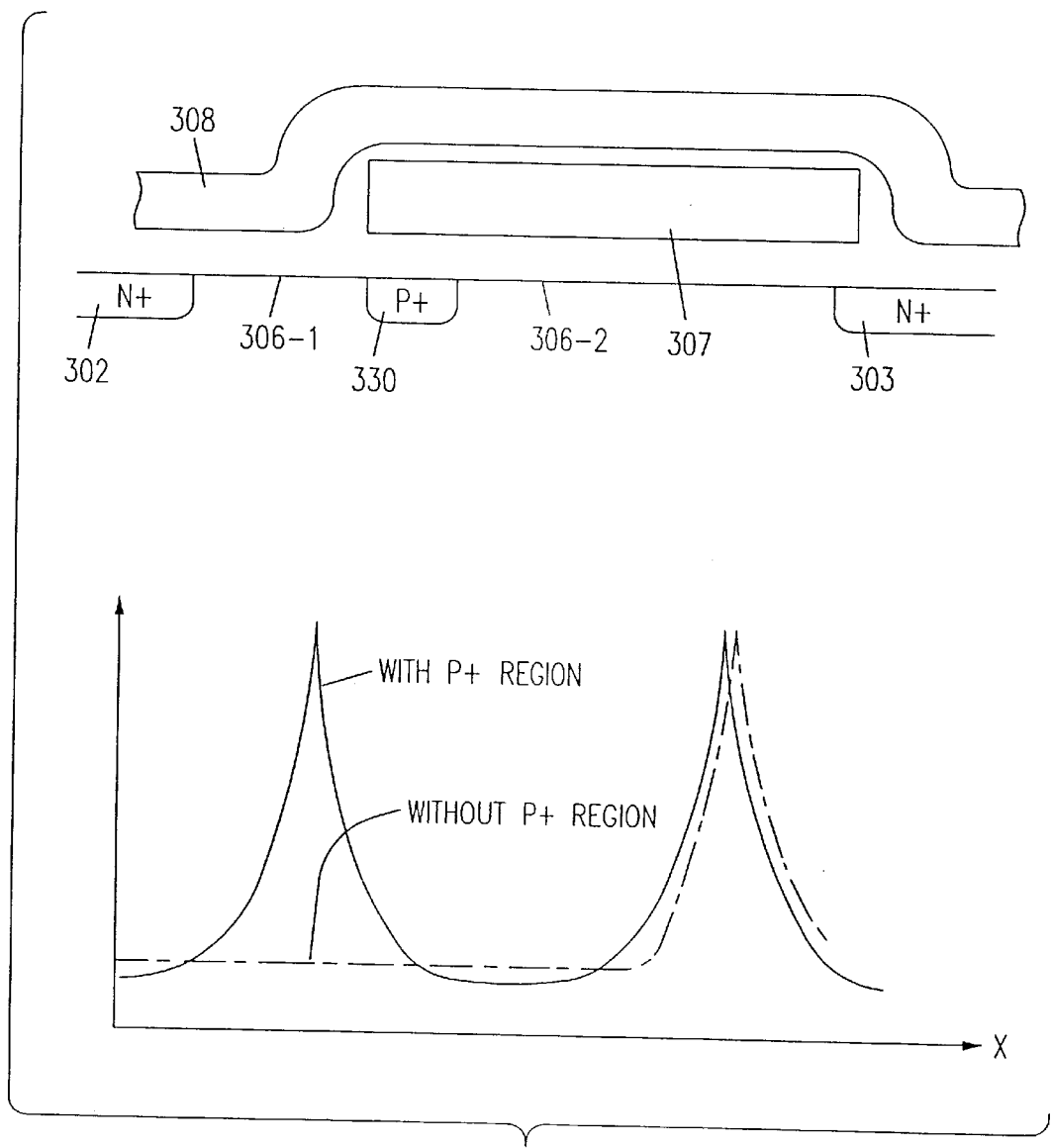
FIG. 4 depicts the electrical field distribution along channels of the device of FIG. 5.

FIG. 4 depicts the electrical field distribution along channels 306-1 and 306-2 in structures with and without poly-doped region 330. In a structure without region 330 and improperly biased select transistor the electron injection can take place in the high field region near drain 303. Because of the transversal field reversal region near drain 303, the resultant injection efficiency is reduced. In a structure with region 330 the injection takes place in the high field region located at region 330, far away from the field reversal region. Because of this, increased injection efficiency is achieved.

From the processing side there are three problems which must be addressed properly:

1. The formation of sufficiently thin/high quality gate dielectric over BN+, which tends to oxidize more quickly than undoped silicon.
2. The misalignment between poly 1 and the buried N+ drain diffusion strongly affects the coupling ratios for programming and erase. This can be overcome at the expense of an increase in cell area by not using a virtual ground array, but instead a shared source array.
3. This array permits floating gate 307 to completely overlap the buried N+ diffusion in a dedicated source arrangement, eliminating this alignment sensitivity. Unfortunately, this array requires an extra isolation spacing adjacent to the BN+ to prevent the poly 1 extension beyond BN+ in the direction away from channel 306-2 to form a transistor in the neighboring cell.

To achieve small cell size in the buried diffusion direction a channel stop isolation is used between adjacent cells, plus a self-aligned stacked etch to simultaneously delineate poly 2 and poly 1. This is difficult to do without pitting the substrate as well as the exposed BN+ when etching the exposed poly 1 between adjacent cells. This is especially difficult to avoid when etching the decoupling oxide (1500–2000 Å thick on top of poly 1 in order to expose poly 1, since the substrate unprotected by poly 1 also becomes exposed, so that when poly 1 is etched, the substrate in those regions becomes pitted.

Figure 6:
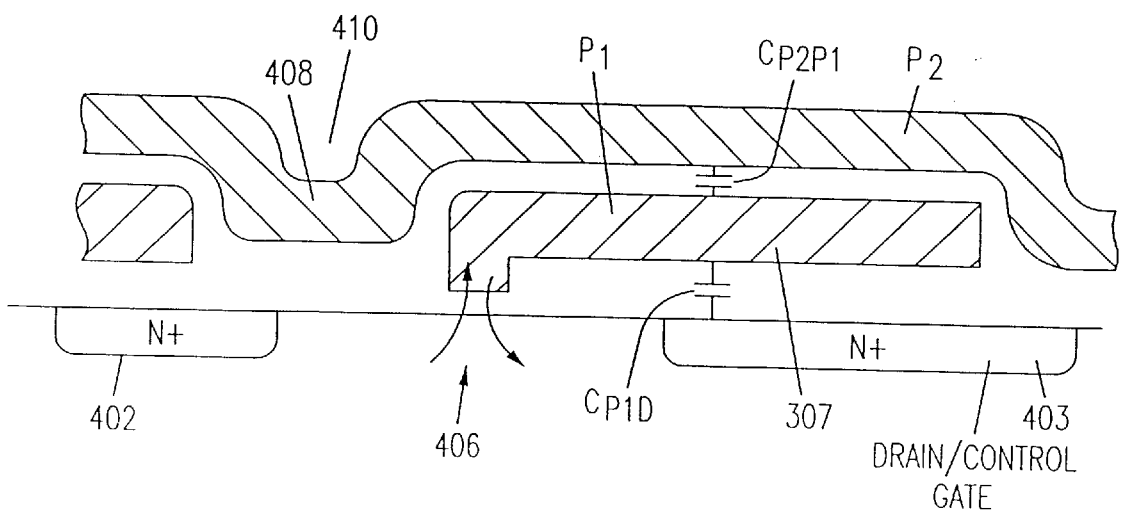
FIG. 6 is a cross-sectional view of another embodiment of a 2-poly cell of this invention.

This will therefore require formation of a thick dielectric region as part of the field isolation process protecting the substrate in the space between the poly 2 word lines. This can be accomplished by using a process as described in U.S. patent application Ser. No. 323,779, filed Mar. 15, 1989, and assigned to SunDisk, the assignee of this application. This is actually forming trench isolation, but with BN+ abutting this trench, we may experience severe junction leakage as well as loss of a portion of the BN+ conductor. This cell of this second embodiment is attractive because it is double poly, low programming current, very fast programming, programming away from drain junction, small and scalable cell. Cell size is quite attractive as indicated below for three representative geometries:

1.0$\mu$geometries: cell=4.0×2.0=8.0$\mu^2$
0.8$\mu$geometries: cell=3.2×1.6=5.2$\mu^2$
0.6$\mu$geometries: cell=2.3×1.2=2.8$\mu^2$ Third Embodiment FIG. 6 is a cross-sectional view of alternative embodiment of a two poly cell, using source side injection for programming, aided by strong coupling to buried N+ drain 403, which acts also as a second control gate. Erase is by Fowler-Nordheim tunneling to channel 406 through a small thinned oxide region, formed for example to a thickness of about 100 Å, by utilizing a thin polyspacer. These process steps would be as follows: Once the drain oxide is formed (i.e. the oxide above drain 403), a first layer of poly, (approximately 2000 Å to 4000 Å thick) is deposited and a thin nitride dielectric is deposited on top. These layers are then etched using a poly 1 mask to delineate the lateral extent (as shown in FIG. 6) of the poly 1. The exposed oxide layer over the channel portion of the substrate is then stripped and regrown to the 100 Å thickness required for tunneling, while a photoresist masked pattern protects oxide over the exposed, BN+ side of the poly 1 from being stripped. The nitride overlayer on poly 1 prevents oxide from forming on that poly. The thin nitride is then etched off using a highly selective etch which does not attack or degrade the 100 Å tunnel oxide (e.g. hot phosphoric or plasma etch). This is followed by a second poly deposition which electrically contacts the first poly on its top surface. This structure is then etched using an anisotropic polysilicon etch, with etch being terminated with the re-exposure of the oxide layers over substrate beneath the second deposited poly layer. This completes the formation of the poly 1 floating gate stripe shown in FIG. 6. The remaining process is similar to that of the second embodiment.

In this embodiment, programming is from hot channel electrons injected from grounded source diffusion 402 with drain 403 held at about +8v and fixed control gate of around 1.5v. Alternatively, programming is performed by hot channel electrons from source diffusion 402 utilizing a sawtooth control gate voltage ranging from 0 volts to a peak voltage approximately 3 volts, as described previously for the second embodiment. Read is achieved with $V_{DS}$=1.5V, Vs=0, $V_{CG}$=+5V. Erase is achieved with $V_{CG}$=-22V, Vs=Vd=OV. In this embodiment, the poly 2 word line 408 will carry the +5 volts during read and the -22 volts during erase, thereby requiring an X-decoder capable of serving this purpose. Coupling considerations require that $C_{P2P1}>C_{P1D}$, which is unfavorable for programming. Therefore the cell must be optimized for balancing erase against programming by adjusting oxide thicknesses and floating gate threshold to the optimum print. There is less of a problem with pitting the field regions between cells in the poly 1 direction (because poly 1—poly 2 oxide or ONO is thin). This may obviate the need for the additional thick oxide field region described for the second embodiment. However, there is the additional process complexity of forming the thin oxide region and extra space needed to place this thin oxide region sufficiently far from the source diffusion.

Alternative Operating Methods

A number of alternative methods are possible to program the source side injection cells described in the previous embodiments. Strong capacitive coupling (for example, using thin ONO) is required in the second and third embodiments between poly 2 and poly 1 for programming. During operation, one embodiment applies $V_D$ at 5 to 7v, $V_S$=O, the control gate voltage $V_{CG}$ is raised to just turn on the control gate channel, and $V_{p2}$ is on the order of about 12 volts or more. Alternatively, the source body effect is used to advantage. In this alternative embodiment, rather than bringing control gate to a specified value to just turn on the channel, the control gate is brought to a value greater than the voltage required to just turn on the channel (e.g., approximately one volt above) and a pull-down circuit is used (e.g., a high impedance resistor or a current sink) for providing approximately 1 $\mu$current flow via source debiasing. Alternatively, the control gate voltage $V_{CG}$ can be operated in a sawtooth fashion from between 0 volts to about +3 volts, as mentioned previously with respect to European patent application serial number All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A memory array comprising:
    a plurality of adjacent bit lines running in a first direction to form a corresponding plurality of columns;
    a plurality of word lines running in a second direction generally perpendicular to said first direction to form a corresponding plurality of rows;
    a plurality of memory cells, each memory cell being associated with the intersection of one of said bit lines and one of said word lines;
    a shift register comprising:
       an data input port for receiving data to be stored by a selected one of said memory cells;
       a plurality of storage elements, each associated with one of said word line, for storing said data to be stored by said memory cells; and
       control circuitry for serially receiving a plurality of data values from said input port, each said data value associated with one of said word lines, and storing said plurality of data values for writing into corresponding ones of said plurality of memory cells along a selected bit line; and
    programming circuitry for establishing voltages on said bit lines to cause one or more of said data values stored in said plurality of storage elements to be written into selected ones of said memory cells along said selected bit line.

2. A memory array as in claim 1 wherein said data values are applied to said word lines for writing.

3. A structure as in claim 1 which further comprises a plurality of segments, each segment including a subarray.

4. A structure as in claim 1 which further comprises a plurality of steering lines running in said first direction.

5. A structure as in claim 1 which further comprises a word line buffer register comprising:
- a parallel input port coupled to a parallel output port of said shift register; and
- a parallel output port coupled to said plurality of word lines.

6. A structure as in claim 5 wherein said shift register reads data values serially in while said word line buffer stores previously received data values for writing to said memory cells.

* * * * *